United States Patent
Unton et al.

(10) Patent No.: US 12,432,877 B2
(45) Date of Patent: Sep. 30, 2025

(54) POLYMERIC COLD PLATE FOR THERMAL MANAGEMENT OF POWER ELECTRONICS

(71) Applicant: Rolls-Royce North American Technologies Inc., Indianapolis, IN (US)

(72) Inventors: Timothy Unton, Indianapolis, IN (US); Eric Donovan, Indianapolis, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 245 days.

(21) Appl. No.: 18/209,664

(22) Filed: Jun. 14, 2023

(65) Prior Publication Data
US 2024/0422950 A1    Dec. 19, 2024

(51) Int. Cl.
H05K 7/20    (2006.01)
H01L 23/40   (2006.01)
H01L 23/473  (2006.01)

(52) U.S. Cl.
CPC ....... H05K 7/20254 (2013.01); H01L 23/473 (2013.01); *H01L 23/4006* (2013.01); *H05K 7/20772* (2013.01)

(58) Field of Classification Search
CPC ............ H05K 7/20254; H05K 7/20772; H01L 23/473; H01L 23/4006
See application file for complete search history.

(56) References Cited

U.S. PATENT DOCUMENTS

| | | | | |
|---|---|---|---|---|
| 4,072,188 | A * | 2/1978 | Wilson | F28F 3/12 165/83 |
| 4,938,279 | A * | 7/1990 | Betker | H01L 23/473 165/DIG. 48 |
| 5,323,292 | A * | 6/1994 | Brzezinski | H01L 23/433 361/689 |
| 5,394,299 | A * | 2/1995 | Chu | H01L 23/4338 165/79 |
| 5,453,911 | A * | 9/1995 | Wolgemuth | H05K 7/20927 361/689 |
| 6,690,578 | B2 * | 2/2004 | Edelmann | H05K 7/20454 174/15.1 |
| 7,007,741 | B2 * | 3/2006 | Sen | H01L 23/473 257/E23.09 |
| 8,391,008 | B2 | 3/2013 | Dede | |
| 9,282,678 | B2 | 3/2016 | Campbell et al. | |
| 2006/0187639 | A1 * | 8/2006 | Carswell | H05K 7/2079 165/80.4 |

FOREIGN PATENT DOCUMENTS

EP    0435586 A2 *   7/1991
WO    2010130993 A2  11/2010

* cited by examiner

*Primary Examiner* — Zachary Pape
(74) *Attorney, Agent, or Firm* — Barnes & Thornburg

(57) ABSTRACT

A power electronic assembly includes a power electronic and a cold plate. The power electronic is configured to be powered by electric energy and to generate waste heat from the electric energy. The cold plate include polymeric material and is configured to elastically deform to uniformly cover the power electronic and transfer away the waste heat generated by the power electronic.

14 Claims, 3 Drawing Sheets ns, the method includes passing the pressurized fluid through the fluid channel to cause the membrane to deform elastically and expand away from the back plate. In some embodiments, the membrane has a thickness of between about 5 thousandths of an inch and about 20 thousandths of an inch.

POLYMERIC COLD PLATE FOR THERMAL MANAGEMENT OF POWER ELECTRONICS

FIELD OF THE DISCLOSURE

The present disclosure relates generally to thermal management of power electronics such as, for example, processors; and more specifically to cold plates for the thermal management of said power electronics.

BACKGROUND

Data centers may use large amounts of electricity to power their power electronics such as, for example, computer processors. Much of the electricity is subsequently turned into heat by the power electronics. It may be desirable to remove the generated heat from the power electronics and ambient environment of the data center to prevent overheating of the power electronics.

Increasing the efficiency of the heat removal processes and components may lower total energy costs and the environmental impact of powering the electronic devices. Typical cooling processes use air based cooling to reject heat from the power electronics to cooled air within the data center facility and/or to outside ambient air. As a result, cooling may be inefficient and use large amounts of energy for producing the conditioned cooling air (via an air handler, air conditioner, HVAC system). Liquid cooling may provide greater cooling efficiency as compared to air cooling. However, liquid cooling typically includes greater upfront capital costs and times for the large scale uses of data centers.

SUMMARY

The present disclosure may comprise one or more of the following features and combinations thereof.

According to an aspect of the present disclosure, a power electronic assembly includes a power electronic and a cold plate. The power electronic includes a circuit board and a processor coupled with the circuit board. The processor is configured to be powered by electric energy and to generate waste heat from the electric energy. The processor has a planar external surface opposite the circuit board. The cold plate is configured to transfer the waste heat generated by the processor away from the processor. The cold plate includes a polymeric coolant housing that defines a fluid channel therethrough and a back plate coupled with the polymeric coolant housing to close a mouth of the fluid channel. The polymeric cooling housing is configured to receive and pass a flow of cooling fluid through the fluid channel and to deform elastically in response to receiving the flow of cooling fluid to provide uniform contact and heat transfer between the polymeric coolant housing and the planar external surface of the processor.

In some embodiments, the polymeric coolant housing includes a first end wall, a second end wall, and a membrane. The first end wall has an inlet that opens into the fluid channel. The second end wall has an outlet that opens into the fluid channel. The membrane is made of polymeric material that extends between and interconnects the first end wall and the second end wall. The membrane is configured to deform elastically and expand outward away from the back plate and into direct contact with the external surface of the processor in response to the cold plate receiving fluid through the flow channel.

In some embodiments, the external surface of the processor has a first length and the membrane has a second length. The second length is greater than the first length such that a portion of the membrane between the first end wall and the processor expands into a gap between the processor and the first end wall of the coolant housing.

In some embodiments, the membrane has a thickness of between about 5 thousandths of an inch and about 20 thousandths of an inch. In some embodiments, the membrane has a thickness of between about 7 thousandths of an inch and about 12 thousandths of an inch.

In some embodiments, the back plate is made of metallic material. The first end wall and the second end wall of the coolant housing are engaged with the back plate. In some embodiments, the back plate and the coolant housing are integrally formed from polymeric material as a one-piece, single component. In some embodiments, the back plate and the coolant housing are made of polymeric material and the coolant housing is engaged with the back plate.

In some embodiments, the membrane directly engages the external surface of the processor without a thermal interface material therebetween. In some embodiments, the cold plate further includes fasteners that extend into the back plate and into the circuit board to couple the cold plate with the power electronic.

According to another aspect of the present disclosure, a method of making a cold plate for a power electronic may include a number of steps. The method may include molding a coolant housing made of polymeric material. The coolant housing may include a first end wall, a second end wall, and a membrane that extends between and interconnects the first end wall and the second end wall. The first end wall, the second end wall, and the membrane may cooperate to define a fluid channel. The method may further include providing a back plate and coupling the first end wall and the second end wall with the back plate to close a mouth of the fluid channel. The membrane has a thickness sized to allow the membrane to deform elastically and expand in response to a pressurized fluid passing through the fluid channel.

In some embodiments, the method includes passing the pressurized fluid through the fluid channel to cause the membrane to deform elastically and expand away from the back plate. In some embodiments, the membrane has a thickness of between about 5 thousandths of an inch and about 20 thousandths of an inch.

In some embodiments, the method further includes passing the pressurized fluid through the fluid channel at a pressure of less than about 50 psi absolute to cause the membrane to deform elastically and expand away from the back plate. In some embodiments, the membrane has a thickness of between about 7 thousandths of an inch and about 12 thousandths of an inch.

These and other features of the present disclosure will become more apparent from the following description of the illustrative embodiments.

DETAILED DESCRIPTION OF THE DRAWINGS

Figure 1:
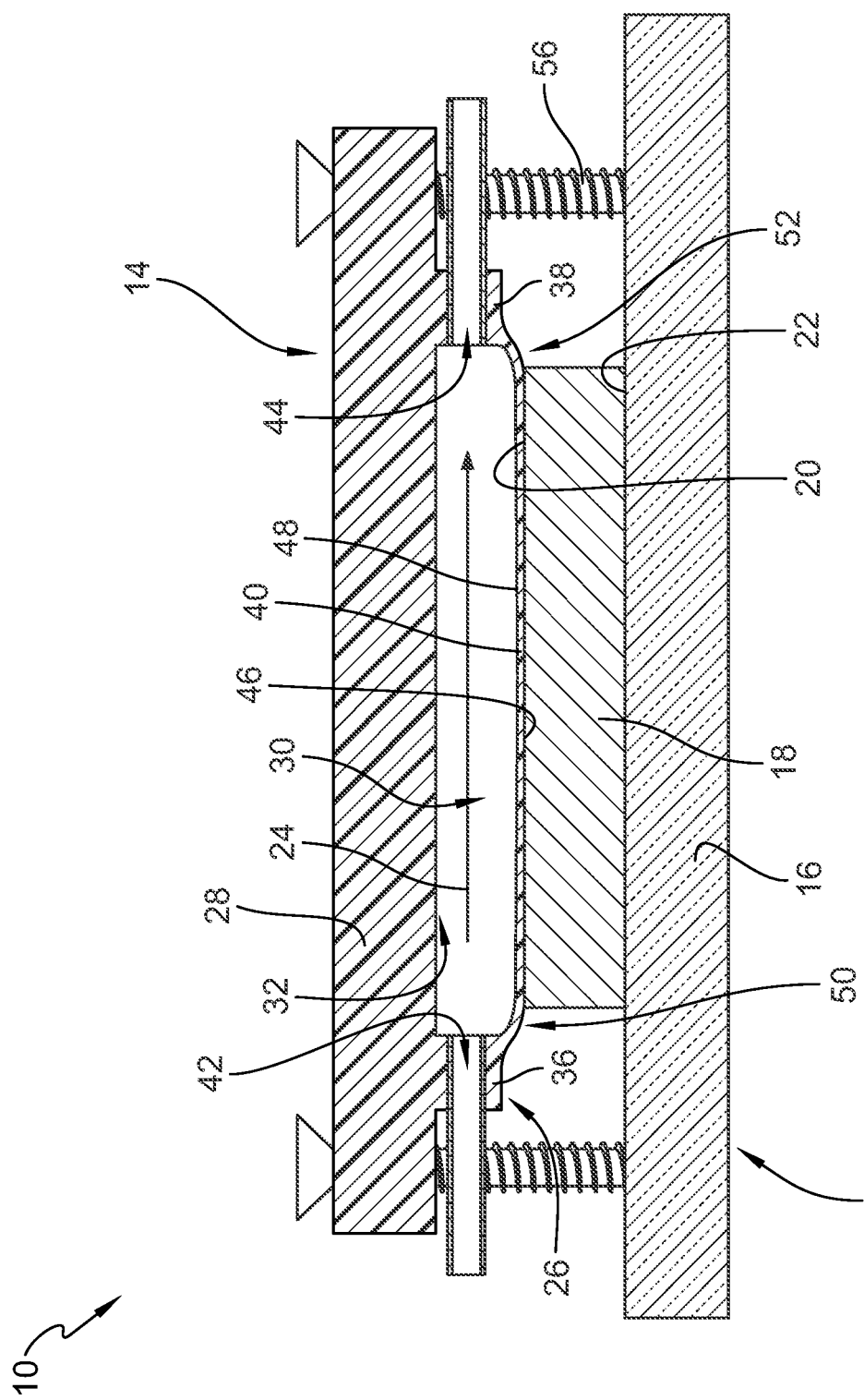
FIG. 1 is a diagrammatic and cross-section view of a power electronic assembly in accordance with the present disclosure including a power electronic having a circuit board and a processor that generates heat during use and further including a cold plate configured to transfer the heat away from the power electronic, the cold plate including a back plate and a polymeric coolant housing that has expanded to uniformly cover the processor in response to coolant flowing through the cold plate.

For the purposes of promoting an understanding of the principles of the disclosure, reference will now be made to a number of illustrative embodiments illustrated in the drawings and specific language will be used to describe the same.

Figure 2:
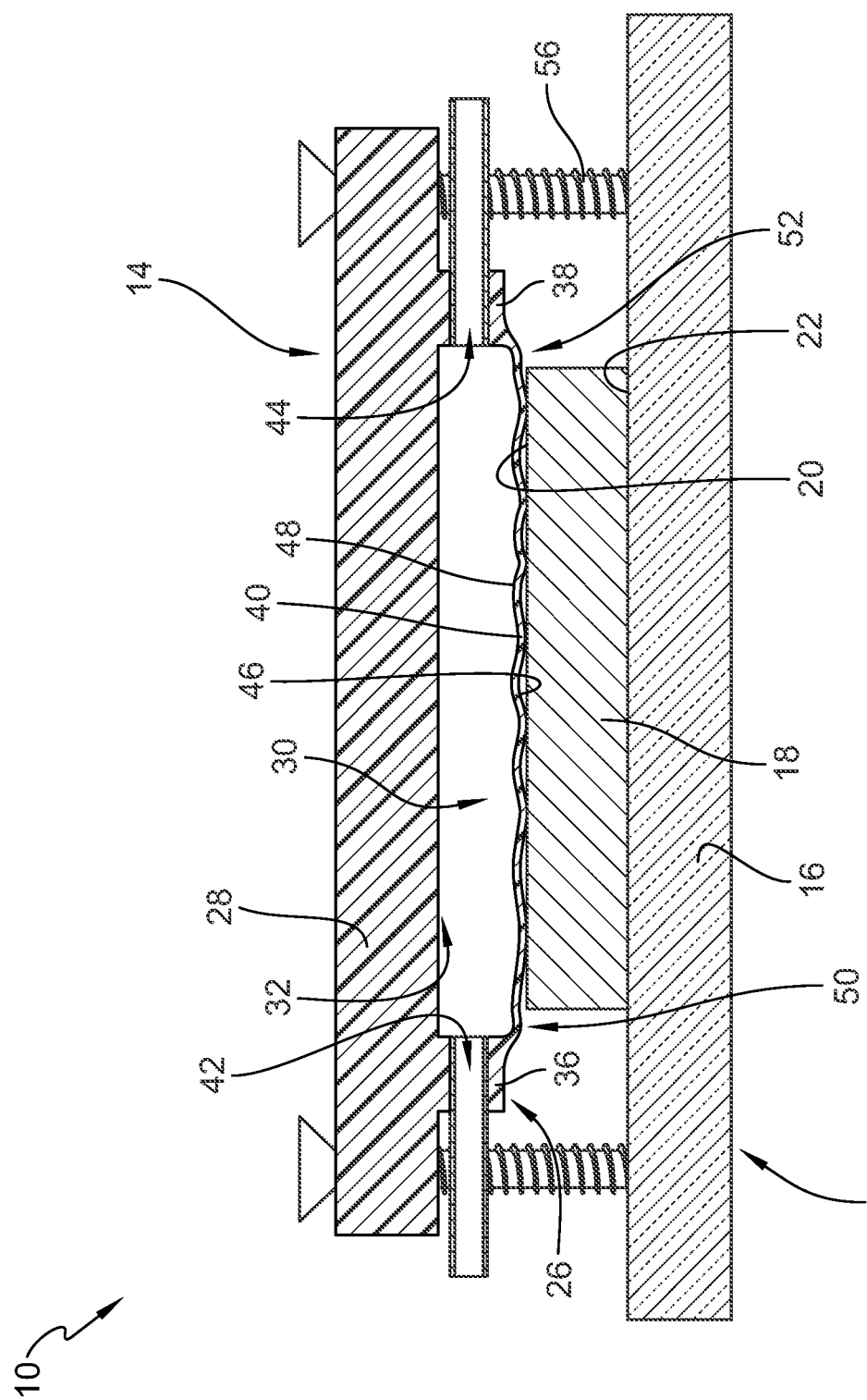
FIG. 2 is a diagrammatic and cross-section view of the power electronic assembly of FIG. 1 showing the assembly without coolant being supplied to the cold plate such that the coolant housing is not expanded and showing, with exaggerated proportions, that contact between the cold plate and the processor is reduced.

A power electronic assembly 10 includes a power electronic 12 and a cold plate 14 as shown in FIGS. 1 and 2. The power electronic 12 is configured to be powered by electric energy and to generate waste heat from the electric energy. The cold plate 14 is engaged with the power electronic 12 and is configured to receive and pass a cooling fluid through the cold plate 14 to remove heat from the power electronic 12. The cooling fluid 24 may include for example, water, refrigerant, air, gases, etc.

The cold plate 12 includes a polymeric coolant housing 26 and a back plate 28 that covers the coolant housing 26. The coolant housing 26 is configured to elastically deform to uniformly cover the power electronic 12 and transfer away the waste heat generated by the power electronic 12 in response to the cooling fluid being passed through the cold plate 14. The cold plate 12 of FIGS. 1 and 2 includes a polymeric coolant housing 26 and a polymeric back plate 28. Another embodiment of a cold plate 212 shown in FIG. 3 has a polymeric coolant housing 226 and a back plate 228 of a different material such as metallic material. The cold plate 14 includes fasteners 56 that extend into the back plate 28 and into the circuit board 16 to couple the cold plate 14 with the power electronic 12. In some embodiments, spacers and/or bushings may be installed around and/or near the fasteners 56 to position the cold plate 14 relative to the power electronic.

In the illustrative embodiment, the power electronic 12 includes a circuit board 16 and a processor 18 coupled with the circuit board 16. The processor 18 is configured to receive and process input from a user as well as instructions stored on a memory connected with the processor 18. The processor 18 has a generally planar external surface 20 that faces away from the circuit board 16 and an interior surface 22 that typically includes pins that couple with the circuit board 16. The processor 18 uses electric energy to operate and generates waste heat that is expelled largely through the external surface 20.

The cold plate 14 has a membrane 40 that is made of polymeric material and touches the computing processor 18 directly to conduct heat away to the cooling fluid 24. In the illustrative embodiment, one of the plastic cold plates 14 is fitted inside a server in a data center, for example, and connected directly to the top of each processor 18 (typically there may be 2, but some systems pack more or less processors in smaller space). The plastic cold plate 14 may include quick disconnect fittings for easy maintenance of the server and be designed to deliver subcooled liquid directly to the computing server. The pressure of the cooling fluid 24 in the illustrative embodiment is low which allows a thickness of the membrane 40 between the processor 18 and cooling fluid 24 to be small. In some embodiments, the membrane 40 has a thickness of between about 5 thousandths of an inch and about 20 thousandths of an inch. In some embodiments, the membrane 40 has a thickness of between about 7 thousandths of an inch and about 12 thousandths of an inch.

Additionally, the formability of the plastic material of the cold plate 14 may allow for an improved thermal interface to the processor 18 due to the deformation and expansion of the cold plate 14 in response to the pressure of the cooling fluid 24, thus, lowering the overall thermal resistance. In some embodiments, the cooling fluid 24 may be refrigerant that is vaporized in response to receiving the heat from the processor 18.

To overcome the high capital cost associated with conventional fluid and/or liquid cooling, the cold plate 14 is made of plastic and the membrane 40 (interface layer) between the heat generating device (processor 18) and coolant is thin. By being made of plastic, the coolant housing 26 and, in some embodiments, the back plate 28, are inexpensive and may be more easily mass produced. For cold plate 14 efficiencies, it may be desirable to have uniform contact between the heat generating device 18 and the cold plate 14, otherwise hotspots can occur when non-uniform contact is present. For conventional metallic cold plate, this may typically be accomplished by firstly controlling both the processor and the cold plate to a high degree of flatness (which adds cost in machining and inspection) and secondly by adding a thermal interface material (TIM) between the cold plate and the processor to ensure thermal contact.

The cold plate 14 of the present disclosure takes advantage of the natural flexibility in the plastic of the membrane 40 to bow out and form good contact with the processor 18. As a result, thermal interface material is not used in the present embodiment, though may be used with the cold plate 14 in other embodiments. FIG. 1 shows the concept where the thin membrane 40 of plastic bows from its mounting points to form a uniform contact layer with the processor 18. In illustrative embodiments, the pressure of the coolant fluid 26 may be between 30-40 psi (absolute) as an example, though other pressures are possible with different thicknesses of polymer. In addition to providing good thermal contact, the processor 18 acts as the support for the thin membrane 99 of polymer. Note that in FIG. 1, the coolant is shown as feeding in from the left and then exiting at the right, but other arrangements such as top feed and return or feed and return on the same side of the cold plate 14 are also possible.

Referring again to FIGS. 1 and 2, the cold plate 14 includes the polymeric coolant housing 26 and the back plate 28. The coolant housing 26 defines a fluid channel 30 therethrough. The back plate 28 is coupled with the polymeric coolant housing 26 to close a mouth 32 of the fluid channel 30. The back plate 28 is integrally formed with the coolant housing 26 as a one-piece, single component in the illustrative embodiment. In other embodiments, the back plate 28 is made of polymeric material and the coolant housing 26 is made as a separate component from polymeric material and the coolant housing 26 is engaged with and seals with the back plate 28.

When first assembled and not pressurized by cooling fluid 24, the coolant housing 26 may have non-uniform contact with the process 18 as suggested with exaggerated waviness of membrane 40 in FIG. 2. This non-uniform contact may be similar to conventional cold plates that use thermal interface material to compensate for the non-uniform contact. The polymeric cooling housing 26 of the present disclosure receives and passes a pressurized flow of the cooling fluid 24 through the fluid channel 30 which causes the cooling housing 26 to deform elastically as shown in FIG. 1 to provide uniform contact and heat transfer between the polymeric coolant housing 26 and the planar external surface 20 of the processor 18 as shown in FIG. 1.

The coolant housing 26 includes a first end wall 36, a second end wall 38, and a membrane 40 as shown in FIG. 1. The first end wall 36 includes an inlet 42 that opens into the fluid channel 30. The second end wall 38 includes an outlet 44 that is in fluid communication with the fluid channel 30. The membrane 40 has an external surface 46 that engages the processor 18 and an interior surface 48 that faces the fluid channel 30. In the illustrative embodiment, the external surface 46 contacts directly the processor 18 without the use of thermal interface material.

The membrane 40 is made of polymeric material and extends between and interconnects the first end wall 36 and the second end wall 38. The membrane 40 is configured to deform elastically and expand outward away from the back plate 28 and into direct contact with the external surface 22 of the processor 18 in response to the cold plate 14 receiving fluid through the flow channel 30. The processor 18 applies a counter force to the membrane 40 which may help allow the thickness of the membrane 40 to be reduced because the processor 18 is taking a portion of the force load away from the membrane 40.

In the illustrative embodiment, the external surface 22 of the processor 20 has a first length as suggested in FIG. 1. The membrane 40 has a second length and the second length is greater than the first length such that a portion 50 of the membrane 40 between the first end wall 36 and the processor 18 expands into a gap between the processor 18 and the first end wall 36 of the coolant housing 26. Likewise, a portion 52 of the membrane 40 between the second end wall 38 and the processor 18 expands into a gap between the processor 18 and the second end wall 38 of the coolant housing 26.

Figure 3:
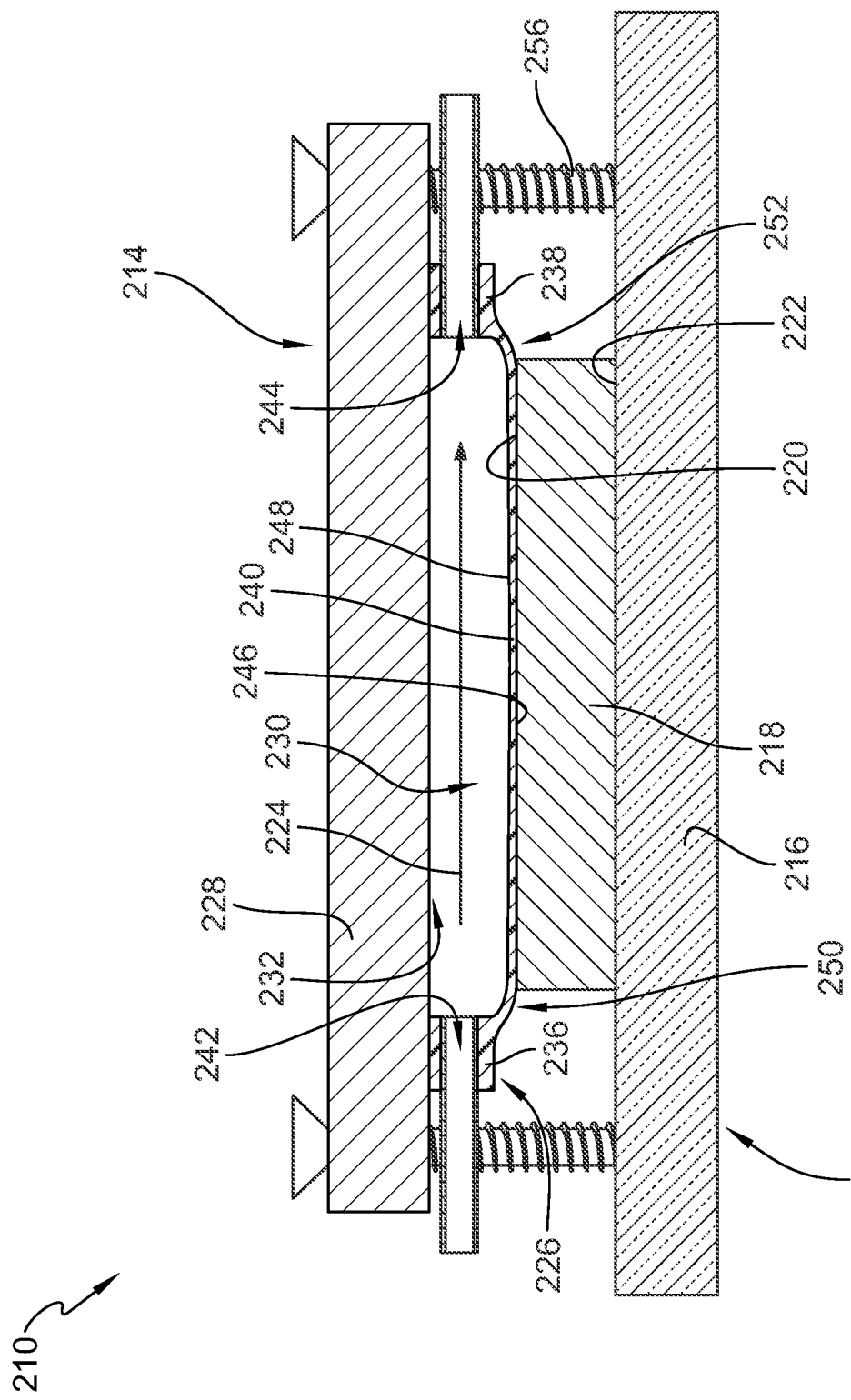
FIG. 3 is a diagrammatic and cross-section view of another power electronic assembly that includes a cold plate having a metallic back plate and a polymeric coolant housing.

Another embodiment of a power electronic assembly 210 is shown in FIG. 3. The power electronic assembly 210 is substantially similar to the power electronic assembly 10 shown in FIG. 1. Elements with reference numbers in the 200 series correspond with the description of their related descriptions for FIGS. 1 and 2 except where otherwise described below. The power electronic assembly 210 includes a power electronic 212 and a cold plate 214. The cold plate 214 includes a polymeric coolant housing 226 and a back plate 228 that is formed separate from the coolant housing 226. In the illustrative embodiment, the back plate 228 is formed of a metallic material such as aluminum. In other embodiments, the back plate 228 may be made of polymeric, metallic, or composite material or any combination thereof.

The power electronic 212 includes a circuit board 216 and a processor 218 coupled with the circuit board 216 as shown in FIG. 3. The processor 218 has a generally planar external surface 220 that faces away from the circuit board 216 and an interior surface 222 that typically includes pins that couple with the circuit board 216. The cold plate 214 includes fasteners 256 that extend into the back plate 228 and into the circuit board 216 to couple the cold plate 214 with the power electronic 212.

The cold plate 214 includes the polymeric coolant housing 226 and the back plate 228. The coolant housing 226 defines a fluid channel 230 therethrough. The back plate 228 is coupled with the polymeric coolant housing 226 to close a mouth 232 of the fluid channel 230. A pressurized flow of a cooling fluid 224 through the fluid channel 230 causes the cooling housing 226 to deform elastically as shown in FIG. 3.

The coolant housing 226 includes a first end wall 236, a second end wall 238, and a membrane 240 as shown in FIG. 3. The first end wall 236 includes an inlet 242 that opens into the fluid channel 230. The second end wall 238 includes an outlet 244 that is in fluid communication with the fluid channel 230. The membrane 240 has an external surface 246 that engages the processor 218 and an interior surface 248 that faces the fluid channel 230. In the illustrative embodiment, the external surface 246 contacts directly the processor 218 without the use of thermal interface material. The back plate 228 is made of metallic material in the illustrative embodiment and the first end wall 236 and the second end wall 238 of the coolant housing 226 are engaged with the back plate 226.

In the illustrative embodiment, the external surface 222 of the processor 220 has a first length as suggested in FIG. 3. The membrane 240 has a second length and the second length is greater than the first length such that a portion 250 of the membrane 240 between the first end wall 236 and the processor 218 expands into a gap between the processor 218 and the first end wall 236 of the coolant housing 226. Likewise, a portion 252 of the membrane 240 between the second end wall 238 and the processor 218 expands into a gap between the processor 218 and the second end wall 238 of the coolant housing 26.

A method of making a cold plate 14, 214 for a power electronic 10, 210 includes a number of steps. The method includes molding the coolant housing 26, 226 made of polymeric material. The coolant housing includes the first end wall 36, 236, the second end wall 38, 238, and the membrane 40, 240 that extends between and interconnects the first end wall 36, 236 and the second end wall 38 238. The first end wall 36, 236, the second end wall 38, 238, and the membrane 40, 240 cooperate to define the fluid channel 30, 230. The method further includes providing the back plate 28, 228. The method includes coupling the first end wall 36, 236 and the second end wall 38, 238 with the back plate 28, 228 to close a mouth of the fluid channel 30, 230. The coupling step may be performed simultaneously, for example, in a blow molding step, such that the back plate 28, 228 and the coolant housing 26, 226 are integrally formed. The coupling step may also be performed by taking the back plate 28, 228 and the coolant housing 26, 226 as separate components and coupling them together.

The membrane 40, 240 has a thickness sized to allow the membrane 40, 240 to deform elastically and expand in response to the pressurized fluid 24, 224 passing through the fluid channel 30, 230. The method may include passing the pressurized fluid 24, 224 through the fluid channel 30, 230 to cause the membrane 40, 240 to deform elastically and expand away from the back plate 28, 228. In some embodiments, passing the pressurized fluid 24, 224 through the fluid channel 30, 230 at a pressure of less than about 50 psi absolute causes the membrane 40, 240 to deform elastically and expand away from the back plate 28, 228.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A power electronic assembly comprising:
a power electronic that includes a circuit board and a processor coupled with the circuit board, the processor configured to be powered by electric energy and to generate waste heat from the electric energy, the processor having a planar external surface opposite the circuit board, and
a cold plate configured to transfer the waste heat generated by the processor away from the processor, the cold plate including a polymeric coolant housing that defines a fluid channel therethrough and a back plate coupled with the polymeric coolant housing to close a mouth of the fluid channel, the polymeric coolant housing configured to receive and pass a flow of cooling fluid through the fluid channel and to deform elastically in response to receiving the flow of cooling fluid to provide uniform contact and heat transfer between the polymeric coolant housing and the planar external surface of the processor,
wherein the polymeric coolant housing includes a first end wall having an inlet that opens into the fluid channel, a second end wall having an outlet that opens into the fluid channel, and a membrane made of polymeric material that extends between and interconnects the first end wall and the second end wall, and the membrane is configured to deform elastically and expand outward away from the back plate and into direct contact with the external surface of the processor in response to the cold plate receiving fluid through the flow channel.

2. The power electronic assembly of claim 1, wherein the external surface of the processor has a first length, the membrane has a second length, and the second length is greater than the first length such that a portion of the membrane between the first end wall and the processor expands into a gap between the processor and the first end wall of the coolant housing.

3. The power electronic assembly of claim 1, wherein the membrane has a thickness of between about 5 thousandths of an inch and about 20 thousandths of an inch.

4. The power electronic assembly of claim 1, wherein the membrane has a thickness of between about 7 thousandths of an inch and about 12 thousandths of an inch.

5. The power electronic assembly of claim 1, wherein the back plate is made of metallic material and the first end wall and the second end wall of the coolant housing are engaged with the back plate.

6. The power electronic assembly of claim 1, wherein the membrane directly engages the external surface of the processor without a thermal interface material therebetween.

7. The power electronic assembly of claim 1, wherein the back plate and the coolant housing are integrally formed from polymeric material as a one-piece, single component.

8. The power electronic assembly of claim 1, wherein the back plate and the coolant housing are made of polymeric material and the coolant housing is engaged with the back plate.

9. The power electronic assembly of claim 1, wherein the cold plate further includes fasteners that extend into the back plate and into the circuit board to couple the cold plate with the power electronic.

10. A method of making a cold plate for a power electronic, the method comprising
molding a coolant housing made of polymeric material, the coolant housing includes a first end wall, a second end wall, and a membrane made of polymeric material that extends between and interconnects the first end wall and the second end wall, the first end wall, the second end wall, and the membrane cooperating to define a fluid channel,
providing a back plate, and
coupling the first end wall and the second end wall with the back plate to close a mouth of the fluid channel,
wherein the membrane has a thickness sized to allow the membrane to deform elastically and expand in response to a pressurized fluid passing through the fluid channel,
wherein the first end wall of the coolant housing includes an inlet that opens into the fluid channel and the second end wall of the coolant housing includes an outlet that opens into the fluid channel.

11. The method of claim 10, further comprising passing the pressurized fluid through the fluid channel to cause the membrane to deform elastically and expand away from the back plate.

12. The method of claim 10, wherein the membrane has a thickness of between about 5 thousandths of an inch and about 20 thousandths of an inch.

13. The method of claim 12, further comprising passing the pressurized fluid through the fluid channel at a pressure of less than about 50 psi absolute to cause the membrane to deform elastically and expand away from the back plate.

14. The method of claim 13, wherein the membrane has a thickness of between about 7 thousandths of an inch and about 12 thousandths of an inch.

* * * * *